United States Patent
Gulati et al.

(10) Patent No.: US 11,001,143 B2
(45) Date of Patent: May 11, 2021

(54) DYNAMICALLY RE-CONFIGURABLE DISPLAYS WITH RECONFIGURABLE REGIONS OF INTEREST FOR SAFETY CRITICAL CONTENT

(71) Applicant: QUALCOMM Incorporated, San Diego, CA (US)

(72) Inventors: Rahul Gulati, San Diego, CA (US); John Chi Kit Wong, Aurora (CA); Peter Koster, Toronto (CA); Reza Kakoee, San Diego, CA (US); Thomas Dannemann, Holzgerlingen (DE)

(73) Assignee: QUALCOMM Incorporated, San Diego, CA (US)

( * ) Notice: Subject to any disclaimer, the term of this patent is extended or adjusted under 35 U.S.C. 154(b) by 54 days.

(21) Appl. No.: 16/225,481

(22) Filed: Dec. 19, 2018

(65) Prior Publication Data

US 2020/0198466 A1  Jun. 25, 2020

(51) Int. Cl.
*B60K 35/00* (2006.01)
*G06F 3/14* (2006.01)
*H03M 13/09* (2006.01)

(52) U.S. Cl.
CPC ............ *B60K 35/00* (2013.01); *G06F 3/1415* (2013.01); *G06F 3/1423* (2013.01); *H03M 13/09* (2013.01); *B60K 2370/1438* (2019.05); *B60K 2370/155* (2019.05)

(58) Field of Classification Search
CPC ..... B60K 35/00; G06F 3/1415; G06F 3/1423; G06F 11/2221; H03M 13/09; G09G 2330/12; G09G 3/006; H04N 17/00
See application file for complete search history.

(56) References Cited

U.S. PATENT DOCUMENTS

| | | | | |
|---|---|---|---|---|
| 2004/0041850 A1* | 3/2004 | Park | ....................... | G09G 3/006 345/60 |
| 2007/0046680 A1* | 3/2007 | Hedrick | ................. | G01C 23/00 345/503 |
| 2010/0283858 A1* | 11/2010 | Katchan | .............. | G06F 11/2221 348/189 |

* cited by examiner

*Primary Examiner* — Anne Marie Antonucci
*Assistant Examiner* — Andrew J Cromer
(74) *Attorney, Agent, or Firm* — The Marbury Law Group, PLLC

(57) ABSTRACT

Systems, methods, and devices of the various embodiments enable dynamic configuration of a number of display regions of interest (ROIs) associated with safety critical content presented on a display, such as a vehicle display. Various embodiments may enable verification of data integrity for ROIs on a display. Various embodiments may enable the selection of different sets of display ROIs from a plurality of independent sets of display ROIs each associated with its own set of stored integrity check values (ICVs). Various embodiments may enable stored ICVs to be used to verify the data integrity of ROIs on a display. Various embodiments may enable the set of display ROIs and the associated ICVs for each display ROI to be changed after a number of frames have been displayed.

22 Claims, 10 Drawing Sheets

DYNAMICALLY RE-CONFIGURABLE DISPLAYS WITH RECONFIGURABLE REGIONS OF INTEREST FOR SAFETY CRITICAL CONTENT

BACKGROUND

Increasingly, automotive vehicles (e.g., cars, trucks, etc.) include display sub-systems, such as instrument clusters, heads-up displays (HUDs), dashboard displays, etc. These display sub-systems can be used to display different types of image data to vehicle operators and passengers, such as entertainment images, rear-view camera images, parking assistance images, tell-tale sign images, etc.

To ensure that functional safety requirements for vehicles, and especially automotive vehicles, are met, the data content integrity for image data displayed by the display sub-systems should be maintained in safety critical applications. A failure to display correct image data can lead to safety violations by a safety critical application. For example, a frozen display in a rear-view camera application can lead to life threatening injuries when images of pedestrians actually behind an automotive vehicle do not appear on the display for the driver to see.

SUMMARY

Systems, methods, and devices of the various embodiments enable dynamic configuration of a number of display regions of interest (ROIs) associated with safety critical content on a display, such as a vehicle display. Various aspects may enable verification of data integrity for ROIs on a display. Various aspects may enable the selection of different sets of ROIs from a plurality of independent sets of ROIs each associated with its own set of stored integrity check values (ICVs). Various aspects may enable stored ICVs to be used to verify the data integrity of ROIs on a display. Various aspects may enable the set of ROIs and the associated ICVs for each ROI to be changed after a number of frames have been displayed, such as after one or more frames have been displayed. In various aspects, the number of frames may be user selected. Various aspects may provide a system-on-chip (SoC) for a display sub-system of a vehicle that automatically rotates between different user selected ROIs to verify data integrity for safety critical content on a vehicle display.

Various aspects may provide for verifying data integrity for regions of interest on a display. Various aspects may include selecting a first set of display regions of interest from a plurality of independent sets of display regions of interest, wherein each of the plurality of independent sets of display regions of interest is associated with its own set of stored integrity check values, determining integrity check values for each display region of interest in the first selected set of display regions of interest based on a first image, determining whether the determined integrity check values match stored integrity check values for each display region of interest in the first selected set of display region of interest, and outputting the first image to a display in response to determining that the determined integrity check values match the stored integrity check values for each display region of interest in the first selected set of display region of interest. Various aspects may include indicating an error in response to determining that the determined integrity check values do not match the stored integrity check values for each display region of interest in the first selected set of display region of interest.

Various aspects may include selecting a second set of display regions of interest from the plurality of independent sets of display region of interest, determining integrity check values for each display region of interest in the second selected set of display regions of interest based on a second image, determining whether the determined integrity check values match stored integrity check values for each display region of interest in the second selected set of display region of interest, and outputting the second image to the display in response to determining that the determined integrity check values match the stored integrity check values for each display region of interest in the second selected set of display region of interest.

In some aspects, the stored integrity check values for each display region of interest in the first selected set of display regions of interest and the stored integrity check values for each display region of interest in the second selected set of display regions may be stored in a same memory. In some aspects, the first set of display regions of interest and the second set of display regions of interest may be user selected.

In some aspects, selecting the second set of display regions of interest from the plurality of independent sets of display regions of interest may include selecting the second set of display regions of interest from the plurality of independent sets of display regions of interest after a number of frames since selecting the first set of display regions of interest from the plurality of independent sets of display region of interest. In some aspects, the number of frames since selecting the first set of display regions of interest may be user selected. In some aspects, the display may be a vehicle display and the first set of display regions of interest and the second set of display regions of interest may be safety critical image areas within the vehicle display.

Further aspects include a vehicle including a processor configured with processor-executable instructions to perform operations of any of the methods summarized above. Further aspects include a processing device for use in a vehicle and configured to perform operations of any of the methods summarized above. Further aspects include a non-transitory processor-readable storage medium having stored thereon processor-executable software instructions configured to cause a processor to perform operations of any of the methods summarized above. Further aspects include a vehicle that includes means for performing functions of any of the methods summarized above. Further aspects include a system-on-chip for use in a vehicle configured to perform operations of any of the methods summarized above.

BRIEF DESCRIPTION OF THE DRAWINGS

The accompanying drawings, which are incorporated herein and constitute part of this specification, illustrate example embodiments of the claims, and together with the general description given above and the detailed description given below, serve to explain the features of the claims.

DETAILED DESCRIPTION

Figure 1:
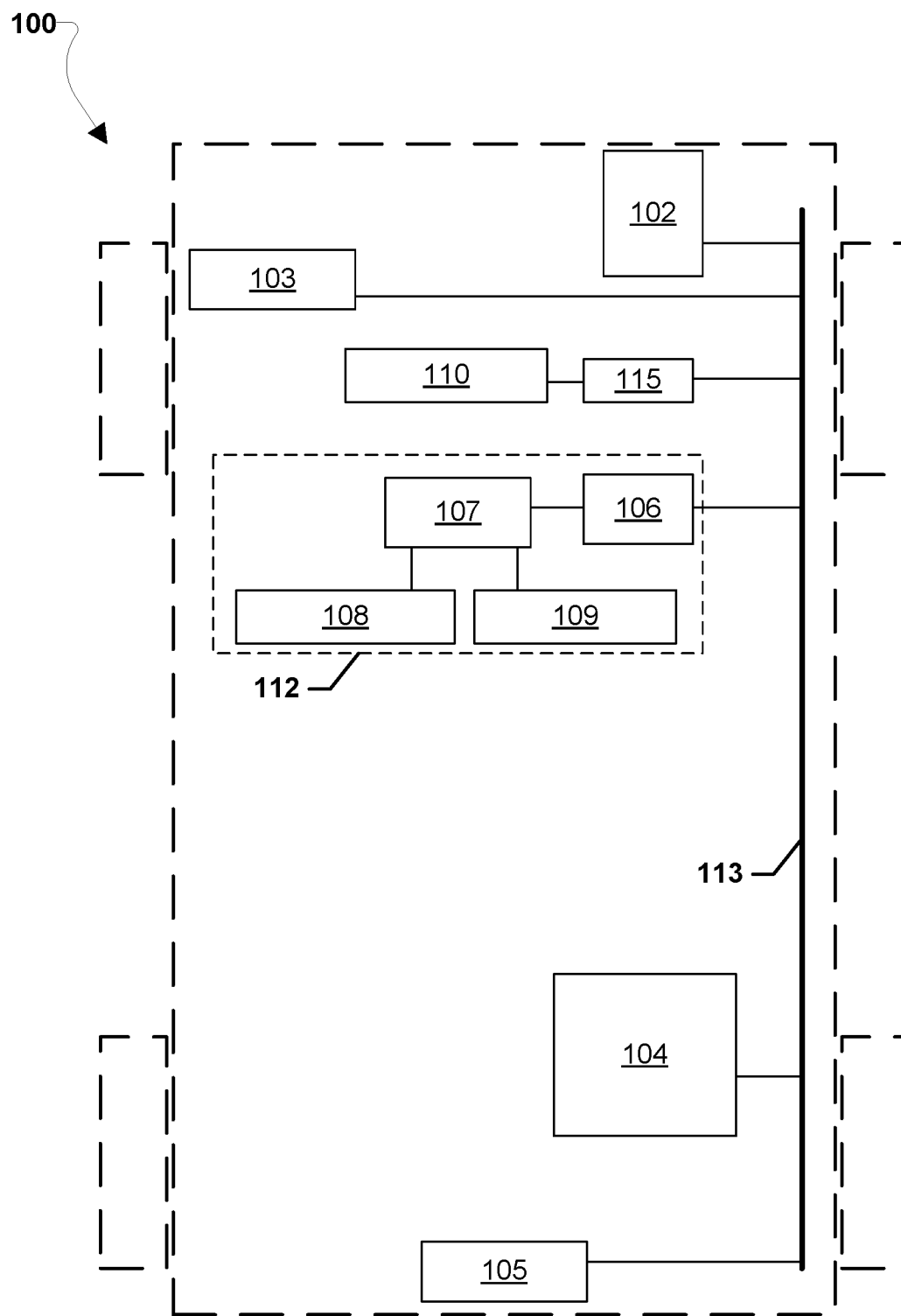
FIG. 1 is a system block diagram of components of an automotive vehicle according to various embodiments.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

As used herein, the term "computing device" refers to any one or all of display sub-systems, driver assistance systems, vehicle controllers, vehicle system controllers, vehicle communication system, infotainment systems, vehicle display systems or subsystems, vehicle data controllers or routers, and similar vehicle electronic devices which include a programmable processor and memory and circuitry configured to perform operations as described herein.

The term "system-on-chip" (SoC) is used herein to refer to a computing device that may be a set of interconnected electronic circuits typically, but not exclusively, including one or more processors, a memory, and a communication interface. The SoC may include a variety of different types of processors and processor cores, such as a general purpose processor, a central processing unit (CPU), a digital signal processor (DSP), a graphics processing unit (GPU), an accelerated processing unit (APU), a sub-system processor, an auxiliary processor, a single-core processor, and a multicore processor. The SoC may further embody other hardware and hardware combinations, such as a field programmable gate array (FPGA), a configuration and status register (CSR), an application-specific integrated circuit (ASIC), other programmable logic device, discrete gate logic, transistor logic, registers, performance monitoring hardware, watchdog hardware, counters, and time references. SoCs may be integrated circuits configured such that the components of the integrated circuit reside on a single piece of semiconductor material, such as silicon.

As used herein, the term "vehicle" refers to one of various types of vehicles that include an onboard computing device. Examples of vehicles include but are not limited to: automotive vehicles (e.g., cars, trucks, etc.); aerial vehicles (e.g., planes, helicopters, etc.), water-based vehicles (i.e., vehicles configured for operation on the surface of the water or under water); and space-based vehicles (e.g., a spacecraft, space plane, etc.). In some embodiments, vehicles may be autonomous or semi-autonomous. In other embodiments, vehicles may require manual operation.

As used herein, the term "user" refers agnostically to any entity, authority or individual interacting with a vehicle and/or component of a vehicle. Examples of users include the original equipment manufacturer (OEM), vehicle component supplier employees, vehicle operators, vehicle passengers, mechanics, etc.

A vehicle may include one or more display sub-systems, such as instrument clusters, dashboard displays, heads-up displays (HUDs), entertainment system displays, augmented displays, etc., that may output images to a user within the vehicle, such as a driver or other passenger. The displays in the display sub-system of a vehicle may be user configurable, thereby enabling a user to arrange where on a display various images may be rendered.

Some or all of the images output on a vehicle display may be safety critical data. Safety critical data may include images associated with driver assistance functions, examples of which include images output by an Advanced Driver Assistance System (ADAS), images received from rear-view cameras, images received from front collision warning systems, images received from traffic sign recognition systems, images received from parking assistance systems, images for instrument cluster displays, images for HUDs, images for augmented displays, etc. As a specific example relevant to automotive vehicles, images for tell-tell signs presented on instrument cluster displays and/or HUDs may be safety critical data. Incorrect presentation of safety critical data may happen when data is corrupted due to permanent faults and/or intermittent faults (e.g., permanent and/or temporary bit flips, etc.) in the display sub-system. Failure to correctly display an image that includes safety critical data may lead to safety violations by a safety critical application. Safety violations by a safety critical application may result in damage to the vehicle, injury to users within the vehicle, and/or harm to persons and property outside the vehicle. Similarly for display sub-systems handing both safety critical data and non-safety critical data, the overwriting of safety critical data by non-safety critical data should be avoided.

To ensure safe operation of a safety critical application, display sub-system failures may need to be identified within a Fault Tolerant Time Interval (FTTI). An FTTI may define a maximum window of time in which faults must be identified and acted upon by a safety critical application. For example, ADAS applications for automotive vehicles may be required to identify and take an action in response to a fault within an FTTI of 250 milliseconds (ms) to 400 ms. The failure to correctly display an image that includes safety critical data and/or the overwriting of safety critical data with non-safety critical data may be example failures that a display sub-system may need to identify and act on within a defined FTTI.

Some display sub-systems may provide users the ability to configure the presentation of information on various vehicle displays. For example, users, such as OEM employees, supplier employees, drivers, passengers, etc., may select the tell-tale signs and other data to be displayed on an instrument cluster display, as well as where on an instrument cluster display the tell-tell signs and other data are to be presented. The ability of users to re-configure displays in this manner presents a challenge to the verification of data integrity for safety critical information because each user may place safety critical information in different areas of a display and multiple different regions of the display may include safety critical information.

Various embodiments may enable verification of data integrity for safety critical information in user configurable displays. Various embodiments may enable data integrity for safety critical information in user configured displays such that a display sub-system may identify and act on faults in image data integrity within a FTTI. Systems, methods, and devices of the various embodiments enable dynamic configuration of a number of display region of interest (ROIs) associated with safety critical content on a display, such as a vehicle display. In various embodiments, a ROI may be a pixel boundary in a display, such as a user configured display, that defines a portion of the display for which data integrity is to be verified. In various embodiments, display ROIs may be user selected.

In various embodiments, a user may configure a display, such as an instrument cluster displays and/or heads up display (HUD) of a vehicle (e.g., an aerial vehicle, an automotive vehicle, etc.). Various features of the display may be configurable, such as the frame rate of the display, the location on the display where particular images will appear, the types of images or icons to be displayed, etc. For example, the user may configure an instrument cluster display of an automotive vehicle by setting the frame rate for the instrument cluster display, selecting tell-tale signs and other images (e.g., a clock face, a temperature reading, etc.) that will appear on the instrument cluster display, and assigning positions for the tell-tale signs and other images on the display. In various embodiments, the user display configuration may be stored in a memory and made available to a computing device, such as an SoC, of the display sub-system of the vehicle.

In response to receiving a user display configuration, a computing device, such as a SoC, may indicate that a selection of sets of display ROIs is available. For example, the computing device may output an indication on the display that a number of sets of display ROIs are available for selection by the user. The indication may detail the maximum number of sets of display ROIs that may be available for selection and/or the maximum number of display ROIs that may be present in each set of display ROIs. In various embodiments, the number of sets of display ROIs that may be available for selection may be controlled by the capacity of a memory assigned to store the sets of display ROIs. For example, a size of a FLASH random-access-memory (FLASH-RAM) or the number of registers forming a memory used to store the set of display ROIs may limit the number of sets of display ROIs that may be available for selection. Additionally, or alternatively, the number of sets or display ROIs that may be available for selection may be controlled by a frame rate setting of the display and a FTTI.

For example, the number of sets of display ROIs that may be available for selection may be limited to the number of frames that occur within a FTTI based on a user selected frame rate for the display. As a specific example, when the FTTI is 300 ms and the frame rate is 30 frames per second (e.g., approx. 33.33 ms per frame), the number of sets of display ROIs that may be available for selection may be limited to 8 sets of display ROIs (i.e., 8 frames time of approx. 266.64 ms) to allow approximately 34 ms within the FTTI of 300 ms to take an action to move to a safe state should an image fault be detected.

In various embodiments, the maximum number of display ROIs that may be present in each set of display ROIs may be defined by the capabilities of a computing device that may validate the display ROIs. For example, the maximum number of display ROIs that may be present in each set of display ROIs may be the maximum number of display ROIs that a processor of the computing may be capable of validating successfully on a per frame basis. For example, the maximum number of display ROIs that may be present in each set of display ROIs may be four display ROIs.

In various embodiments, a computing device, such as a SoC, may receive a user selection of a set of display ROIs in the user display configuration. For example, the user may define pixel boundaries around one or more portions of the display to select the set of display ROIs. As a specific example, the user may select a series of tell-tale images in the user display configuration to select the pixel boundaries of those tell-tale images as display ROIs on the instrument cluster display of an automotive vehicle. The user may select the display ROIs in any manner, such as by touching them when the display is a touch screen, selecting the display ROIs with a human machine interface device (e.g., trackball, buttons, etc.), etc. Each set of display ROIs defined or selected by the user may be independent of other sets of display ROIs defined by the user. As an example, sets of display ROIs may include different numbers of display ROIs. While each set of display ROIs may be independent of one another, one or more display ROIs in any given set may be repeated in other sets of display ROIs. Additionally, each display ROI defined in any given set of display ROIs may be independent of the other display ROIs in that set. For example, different display ROIs within each display ROI set may have different pixel sizes and/or may have different shapes.

In various embodiments, a computing device, such as a SoC, may determine integrity check values (ICVs) for each display ROI in the user selected set of display ROIs. An ICV may be any type error detecting value, such as a hash, checksum, cyclic redundancy check (CRC), multiple input signature register (MISR), etc. computed based on the image data. Determining the ICVs for each display ROI in the user selected set of display ROIs may include calculating an ICV for each display ROI based on the image data that should be output for the pixel boundary defining that display ROI when no faults are present. In this manner, each ICV may be associated with each display ROI in the user selected set of display ROIs as the ICVs were calculated using the images to appear in the display ROIs. For example, when a display ROI corresponds to a tell-tale sign, the computing device may calculate an error detecting value, such as a hash, checksum, CRC, MISR, etc., for an image stored in a memory for use as the tell-tale sign to determine an ICV for the display ROI.

In various embodiments, the ICVs may be calculated after image processing is applied to the image stored in a memory. For example, image processing may include color processing, layer mixing processing, digital signal processing, and/or other types of processing of the image stored in a memory that may be applied to the image before it is ready to be displayed. In this manner, the ICV may reflect an error value of the image should all image processing occur correctly to output the image on the display and the ICV may be compared against later calculated ICVs of processed images to ensure those images were not corrupted during image processing operations.

In various embodiments, a computing device, such as an SoC, may store the user selected set of display ROIs and associated ICVs. For example, the user selected set of display ROIs and associated ICVs may be stored together in the same memory. The user selected set of display ROIs may be stored as a series of user defined pixel boundaries and the ICVs may be stored as a series of associated error values. As a specific example, the set of display ROIs and associated ICVs may be stored together in their own register in a memory location on the SoC. Similarly, each subsequent set of display ROIs and associated ICVs may be stored in its own register in the memory location. In response to the selection of sets or display ROIs being complete, or the maximum number of sets of display ROIs being reached, the computing device, such as the SoC, may operate the display and verify the data integrity for all sets of display ROIs.

Various embodiments may enable stored ICVs to be used to verify the data integrity of ROIs on a display. A computing device, such as an SoC, may receive an image for display. The image for display may be received from another system or sensor of a vehicle, such as an ADAS, backup camera, etc., and/or may be received by the computing device fetching an image for display. In some embodiments, the image may be a composite image formed from a series of images provided by different sources on the vehicle and combined by a layer mixer into a single image. In various embodiments, the image may be processed by applying various image processing techniques to the image. For example, image processing may include color processing, layer mixing processing, digital signal processing, and/or other types of processing of the image stored in a memory that may be applied to the image before it is ready to be displayed.

In various embodiments, a set of display ROIs may be selected from a plurality of independent sets of display ROIs. In some embodiments, the selection of a set of display ROIs may include a processor of a computing device, such as a SoC, selecting a set of display ROIs based on an ROI operations counter value. In some embodiments, the selection of a set of display ROIs may include a hardware counter controlling a multiplexer to output the selected set of display ROIs. In various embodiments, the selection of a set of display ROIs may change after a number of frames have been displayed, such as after one or more frames have been displayed. In various embodiments, the number of frames may be user selected.

In various embodiments, a processor of computing device, such as a processor of a SoC, may receive a selected set of display ROIs and stored ICVs for each display ROI in the selected set of display ROIs. In various embodiments, the processor may determine ICVs for each display ROI in the selected set of display ROIs based on the processed image. The ICVs may be calculated based on the processed image in the same manner that the stored ICVs were previously calculated. For example, when a display ROI corresponds to a tell-tale sign, the computing device may determine the ICV by calculating an error detecting value, such as a hash, checksum, CRC, MISR, etc., for the processed image using the same process as was used to calculate the stored ICV. The processor may determine whether the determined ICVs match the stored ICVs. For example, the stored ICV may be compared to the calculated ICV based on the processed image to determine whether the values match. When the stored and calculated ICV match, this may indicate that the processed image is error- or fault-free and ready to be output to the display. When the stored and calculated ICV do not match, this may indicate the processed image includes an error or fault. In response to detecting the error or fault, the computing device may indicate an error and take an appropriate action. For example, the computing device may present (display and/or sound) a warning to a user, enter a safety mode of operation for the vehicle may, and/or take another action.

Various embodiments may enable end-to-end data content integrity from source to destination in vehicle systems. Various embodiments may include an SoC for a display sub-system of a vehicle that automatically rotates between different user selected display ROIs to verify data integrity for safety critical content on one or more vehicle displays. In some embodiments, a second SoC located between the actual display and a first SoC of a display sub-system may receive a processed image, a selected set of display ROIs, and stored ICVs for each display ROI in the selected set of display ROIs from the first SoC of the display sub-system. In such embodiments, the second SoC may determine ICVs for each display ROI in the selected set of display ROIs based on the processed image and compare the determined ICVs to the received stored ICVs. The SoC may determine whether the determined ICVs match the stored ICVs. For example, the stored ICV may be compared to the calculated ICV based on the processed image to determine whether the values match. When the SoC determines that the stored and calculated ICVs match, this may indicate to the SoC that the processed image(s) is/are error or fault free and ready to be output to the display or displays. When the SoC determines that the stored and calculated ICVs do not match, this may indicate to the SoC that the processed image includes an error or fault. The SoC may indicate an error and take an appropriate action in response to detecting such an error or fault. For example, the SoC may output a warning to a user, enter a safety mode of operation for the vehicle, and/or take another action. The last-check capability provided by the second SoC may account for errors in transmission of the processed image from the first SoC of the display sub-system to the display.

Various embodiments may enable the data content integrity for image data displayed by a vehicle to be maintained and thereby ensure that functional safety requirements for vehicles may be met. Specifically data content integrity for image data displayed by the vehicle may be maintained by verifying data integrity for regions of interest on a display by selecting a first set of display regions of interest from a plurality of independent sets of display regions of interest, wherein each of the plurality of independent sets of display regions of interest is associated with its own set of stored integrity check values, determining integrity check values for each display region of interest in the first selected set of display regions of interest based on a first image, determining whether the determined integrity check values match stored integrity check values for each display region of interest in the first selected set of display region of interest, and outputting the first image to a display in response to determining that the determined integrity check values match the stored integrity check values for each display region of interest in the first selected set of display region of interest.

In various embodiments, indicating an error in response to determining that the determined integrity check values do not match the stored integrity check values for each display region of interest in the first selected set of display region of interest may enable corrective actions or other safety supporting actions to be taken by a vehicle or vehicle operator in response to the data content integrity for image data not being met.

In various embodiments, selecting a second set of display regions of interest from the plurality of independent sets of display region of interest, determining integrity check values for each display region of interest in the second selected set of display regions of interest based on a second image, determining whether the determined integrity check values match stored integrity check values for each display region of interest in the second selected set of display region of interest, and outputting the second image to the display in response to determining that the determined integrity check values match the stored integrity check values for each display region of interest in the second selected set of display region of interest may enable the data content integrity for image data displayed by a vehicle to be maintained and thereby ensure that functional safety requirements for vehicles may be met.

In various embodiments, selecting a second set of display regions of interest from the plurality of independent sets of display region of interest, determining integrity check values for each display region of interest in the second selected set of display regions of interest based on a second image, determining whether the determined integrity check values match stored integrity check values for each display region of interest in the second selected set of display region of interest, and outputting the second image to the display in response to determining that the determined integrity check values match the stored integrity check values for each display region of interest in the second selected set of display region of interest may enable different sets of regions of interest to be used for displaying safety critical information.

In various embodiments, selecting the second set of display regions of interest from the plurality of independent sets of display regions of interest may include selecting the second set of display regions of interest from the plurality of independent sets of display regions of interest after a number of frames since selecting the first set of display regions of interest from the plurality of independent sets of display region of interest which may enable data integrity checking of different regions of interest changed at a set periodicity, such as after each frame.

FIG. 1 is a system block diagram of components of an automotive vehicle 100 according to various embodiments. The automotive vehicle 100 may include a display sub-system 112 connected to a bus 113, such as a controller area network (CAN) bus or other type vehicle bus, interconnecting various systems and devices in the automotive vehicle 100, such as a rear-view camera 105, tire pressure monitoring system 103, collision warning system 102, and ADAS 104. Other systems and devices that may be connected to the bus 113 may include an autonomous driving system, traffic sign recognition system, parking assistance system, or any other type system suitable for use on an automotive vehicle. In various embodiments, images and/or sensor data may be sent from the rear-view camera 105, tire pressure monitoring system 103, collision warning system 102, ADAS 104, and/or other systems to the display sub-system 112 via the bus 113.

The display sub-system 112 may include a vehicle interface processor 106 connected to the bus 113. The vehicle interface processor 106 may be configured to exchange data between a SoC 107 of the display sub-system 112 and the bus 113. The SoC 107 of the display sub-system 112 may be connected to one or more displays 108, 109. The displays 108, 109 may be any type displays, such as instrument cluster displays, HUDs, augmented displays, etc. In various embodiments, the displays 108, 109 may be user configurable. In various embodiments, the displays 108, 109 may be controlled by the SoC 107. The SoC 107 may process and output images to the displays 108, 109. For example, the SoC 107 may output images for tell-tale signs to the displays 108, 109 to communicate safety critical information to a user of the vehicle 100. In various embodiments, the SoC 107 may be configured to verify data integrity for images prior to the images being displayed on the displays 108, 109.

In some embodiments, the display sub-system 100 may output images to displays via the bus 113, for example to display 110. In such embodiments, a SoC 115 may be connected between the bus 113 and the display 110. The display 110 may be any type display, such as instrument cluster display, HUD, augmented display, infotainment display, etc. In various embodiments, the SoC 107 may be configured to verify data integrity for images prior to the images being output via the bus 113 to the display 110. Additionally, the SoC 115 may be configured to re-verify data integrity for images upon their receipt from the bus 113 and prior to the images being rendered on the display 110.

Figure 2A:
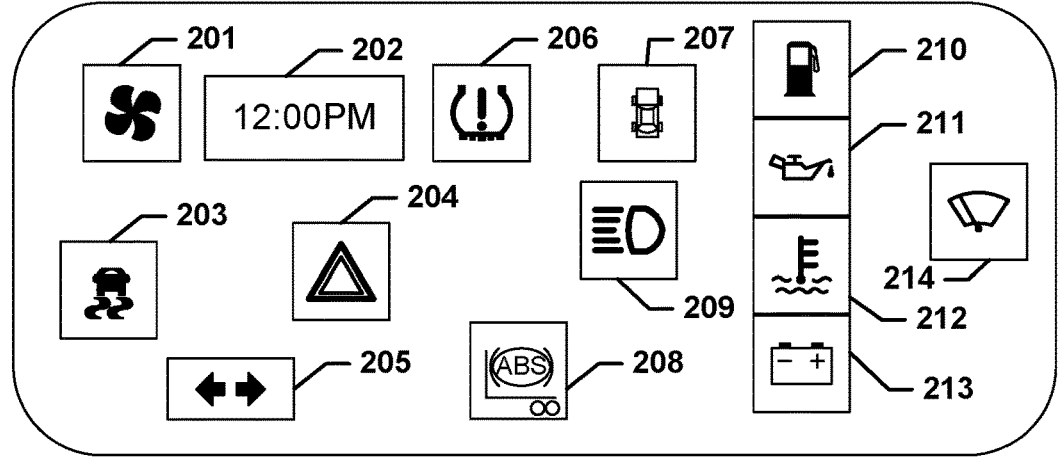
FIGS. 2A, 2B, and 2C illustrate different example user display configurations according to various embodiments.
Figure 2B:
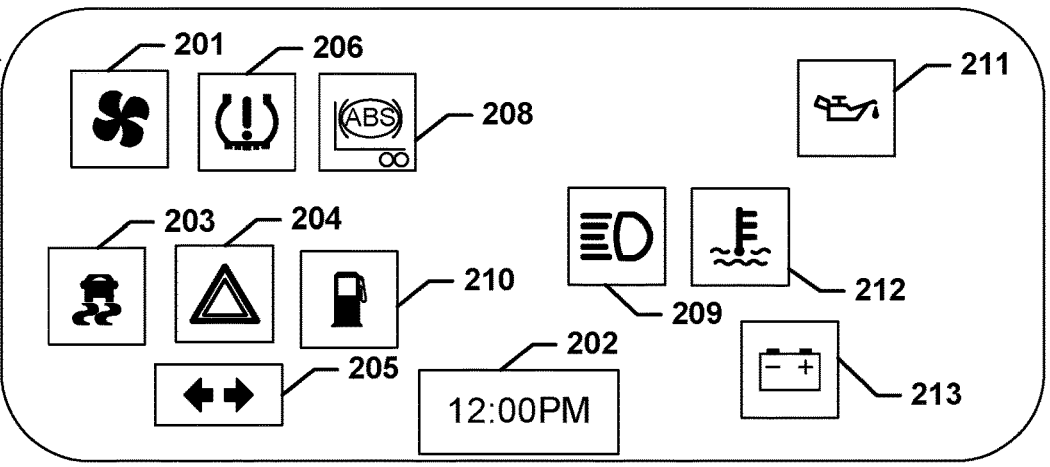
Figure 2C:
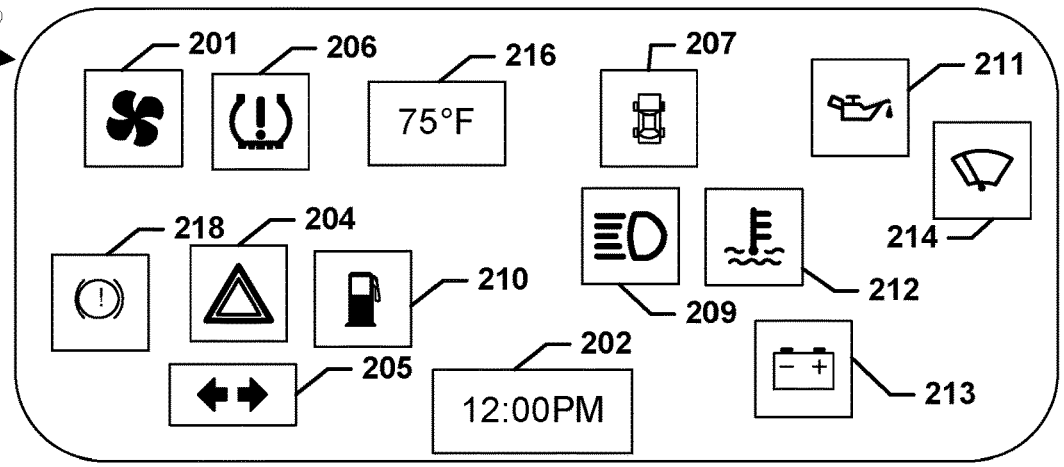

FIGS. 2A, 2B, and 2C illustrate different example user display configurations on a screen of a vehicle display according to various embodiments. With reference to FIGS. 1-2C, the display may be user configurable such that the user may configure the output of the display, such as displays 108, 109, 110.

FIG. 2A shows a first example user configuration 200 of the screen of the display. In the example user configuration 200 illustrated in FIG. 2A, the user selected tell-tale signs 201, 203, 204, 205, 206, 207, 208, 209, 210, 211, 212, 213, and 214, as well as a clock face indication 202 for display. The user arranged those tell-tale signs 201, 203, 204, 205, 206, 207, 208, 209, 210, 211, 212, 213, and 214 and the clock face indication 202 as shown in FIG. 2A.

FIG. 2B shows a second example user configuration 250 of the screen for the display different from the user configuration 200. In the example user configuration 250 illustrated in FIG. 2B, the user selected tell-tale signs 201, 203, 204, 205, 206, 208, 209, 210, 211, 212, and 213, as well as a clock face indication 202 for display. The user arranged those tell-tale signs 201, 203, 204, 205, 206, 208, 209, 210, 211, 212, and 213 and the clock face indication 202 as shown in FIG. 2B which is different than in the user configuration 200 illustrated in FIG. 2A.

FIG. 2C shows a third example user configuration 251 of the screen for the display different from the user configurations 200 and 250. In the example user configuration 251 illustrated in FIG. 2C, the user selected tell-tale signs 201, 204, 205, 206, 207, 209, 210, 211, 212, 213, 214, and 218, as well as a clock face indication 202 and temperature indication 216 for display. The user arranged those tell-tale signs 201, 204, 205, 206, 207, 209, 210, 211, 212, 213, 214, and 218 and the clock face indication 202 and temperature indication 216 as shown in FIG. 2B which is different than in both the user configuration 200 illustrated in FIG. 2A and the user configuration 250 illustrated in FIG. 2B. In various embodiments, the tell-tale signs 201, 203, 204, 205, 206, 207, 208, 209, 210, 211, 212, 213, 214, and 218 may be considered safety critical images, while the clock face indication 202 and temperature indication 216 may be non-safety critical images.

Figure 3:
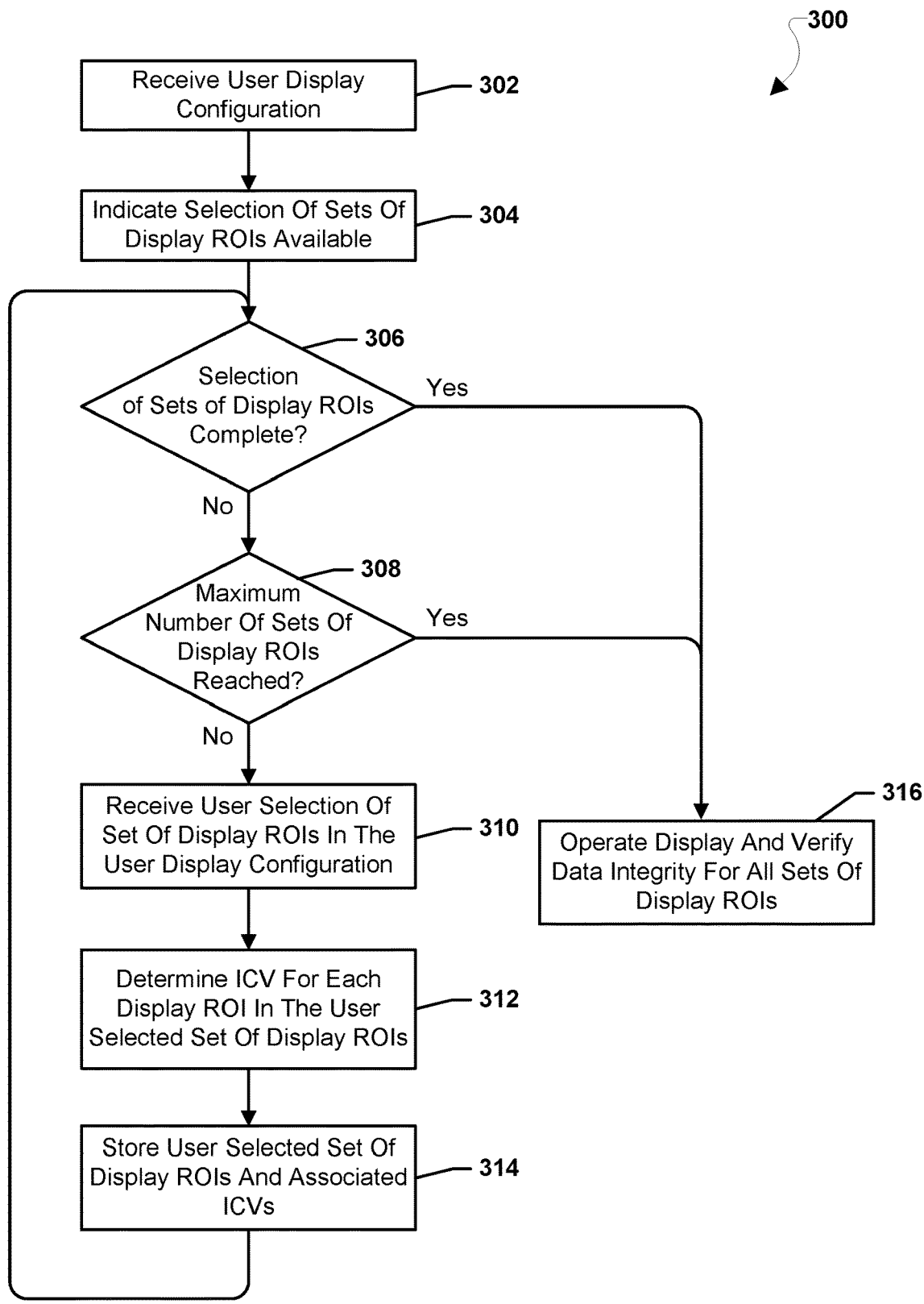
FIG. 3 is a process flow diagram illustrating a method for user selection of sets of display regions of interest (ROIs) according to some embodiments.

FIG. 3 illustrates a method 300 for user selection of sets of display ROIs according to some embodiments. With reference to FIGS. 1-3, the method 300 may be implemented in hardware components and/or software components of a computing device, such as an SoC 107.

In block 302, the computing device may receive a user display configuration. In various embodiments, a user may configure a display, such as an instrument cluster displays and/or HUD of a vehicle (e.g., an aerial vehicle, an automotive vehicle, etc.). Various features of the display may be configurable, such as the frame rate of the display, the location on the display where certain images will appear, the types of images or icons to be rendered on the display, etc. For example, the user may configure an instrument cluster display of an automotive vehicle by setting the frame rate for the instrument cluster display, selecting tell-tale signs and other images (e.g., a clock face, a temperature reading, etc.) for display on the instrument cluster display of an automotive vehicle, and assigning positions for the tell-tale signs and other images on the display. In various embodiments, the user display configuration may be stored in a memory and made available to the computing device. In various embodiments, the user display configuration stored in a memory may be a mapping of images to pixel boundaries on the screen of the display. The computing device may receive the user display configuration upon the user completing a configuration process to select and/or place images on the screen of the display.

In block 304, the computing device may indicate that a selection of sets of display ROIs is available. For example, the computing device may output an indication on the display that a number of sets of display ROIs are available for selection. The indication may detail the maximum number of sets of display ROIs that may be available for selection and/or the maximum number of display ROIs that may be present in each set of display ROIs.

In various embodiments, the number of sets of display ROIs that are available for selection may be controlled by the capacity of a memory assigned to store the sets of display ROIs. For example, a size of a FLASH-RAM or the number of registers forming a memory used to store the set of display ROIs may limit the number of sets of display ROIs that may be available for selection. Additionally, or alternatively, the number of sets or display ROIs that may be available for selection may be controlled by a frame rate setting of the display and a FTTI. For example, the number of sets of display ROIs that are available for selection may be limited to the number of frames that occur within a FTTI based on a user selected frame rate for the display. As a specific example, when the FTTI is 300 ms and the frame rate is 30 frames per second (e.g., approx. 33.33 ms per frame), the number of sets of display ROIs that are available for selection may be limited to 8 sets of display ROIs (i.e., 8 frames time of approx. 266.64 ms) to allow approx. 34 ms within the FTTI of 300 ms to take an action to move to a safe state should an image fault be detected. In various embodiments, the maximum number of display ROIs that are present in each set of display ROIs may be defined by the capabilities of a computing device that may validate the display ROIs. For example, the maximum number of display ROIs that may be present in each set of display ROIs may be the maximum number of display ROIs that the computing may be capable of validating successfully on a per frame basis. For example, the maximum number of display ROIs that may be present in each set of display ROIs may be four display ROIs.

In determination block 306, the computing device may determine whether a selection of sets of display ROIs is complete. For example, the computing device may prompt the user via a pop-up window or other display feature to indicate whether or not the selection of sets of display ROIs is complete, and the computing device may determine whether the select of sets of display ROIs is complete based on the user's response to the prompt. As specific examples, the user selecting a "yes" button may indicate the selection of sets of display ROIs is complete and the user selection a "no" button may indicate the selection of sets of display ROIs is not complete.

In response to determining that the selection of sets of display ROIs is not complete (i.e., determination block 306="No"), the computing device may determine whether the maximum number of sets of display ROIs is reached in determination block 308. In various embodiments, the computing device may determine whether the maximum number of sets of display ROIs is reached by checking whether or not additional memory space is available for storing sets of display ROIs. For example, open memory space available for storing sets of display ROIs may, such as an open register, may indicate the maximum number of sets of display ROIs has not been reached. As another example, the lack of open memory space available for storing sets of display ROIs may indicate the maximum number of sets of display ROIs has been reached.

In response to determining that the maximum number of sets of display ROIs has not been reached (i.e., determination block 308="No"), the computing device may receive a user selection of a set of display ROIs in the user display configuration in block 310. For example, the user may define pixel boundaries around one or more portions of the display to select the set of display ROIs. As a specific example, the user may select a series of tell-tale images in the user display configuration to select the pixel boundaries of those tell-tale images as display ROIs on the instrument cluster display of an automotive vehicle. The user may select the display ROIs in any manner, such as by touching them when the display is a touch screen, selecting the display ROIs with a human machine interface device (e.g., trackball, buttons, etc.), etc. Each set of display ROIs defined or selected by the user may be independent of other sets of display ROIs defined by the user. As an example, sets of display ROIs may include different numbers of display ROIs. While each set of display ROIs may be independent of one another, one or more display ROIs in any given set may be repeated in other sets of display ROIs. Additionally, each display ROI defined in any given set of display ROIs may be independent of the other display ROIs in that set. For example, different display ROIs within each display ROI set may have different pixel sizes and/or may have different shapes.

In block 312, the computing device may determine an ICV for each display ROI in the user selected set of display ROIs. An ICV may be any type error detecting value such as a hash, checksum, CRC, MISR, etc. computed based on the image data. Determining the ICVs for each display ROI in the user selected set of display ROIs may include calculating an ICV for each display ROI based on the image data that should be output for the pixel boundary defining that display ROI when no faults are present. In this manner, each ICV may be associated with each display ROI in the user selected set of display ROIs as the ICVs were calculated using the images to appear in the display ROIs. For example, when a display ROI corresponds to a tell-tale sign, the computing device may calculate an error detecting value, such as a hash, checksum, CRC, MISR, etc., for an image stored in a memory for use as the tell-tale sign to determine an ICV for the display ROI. In various embodiments, the ICVs may be calculated after image processing is applied to the image stored in a memory. For example, image processing may include color processing, layer mixing processing, digital signal processing, and/or other types of processing of the image stored in a memory that may be applied to the image before it is ready to be displayed. In this manner, the ICV may reflect an error value of the image should all image processing occur correctly to output the image on the display and the ICV may be compared against later calculated ICVs of processed images to ensure those images were not corrupted during image processing operations.

In block 314, the computing device may store the user selected set of display ROIs and associated ICVs. For example, the user selected set of display ROIs and associated ICVs may be stored together in the same memory. As an example, the user selected set of display ROIs may be stored in memory as a series of user defined pixel boundaries and the ICVs may be stored in memory as a series of associated error values. As a specific example, the set of display ROIs and associated ICVs may be stored together in their own register in a memory location on the SoC. Similarly, each subsequent set of display ROIs and associated ICVs may be stored in its own register in the memory location.

Figure 6:
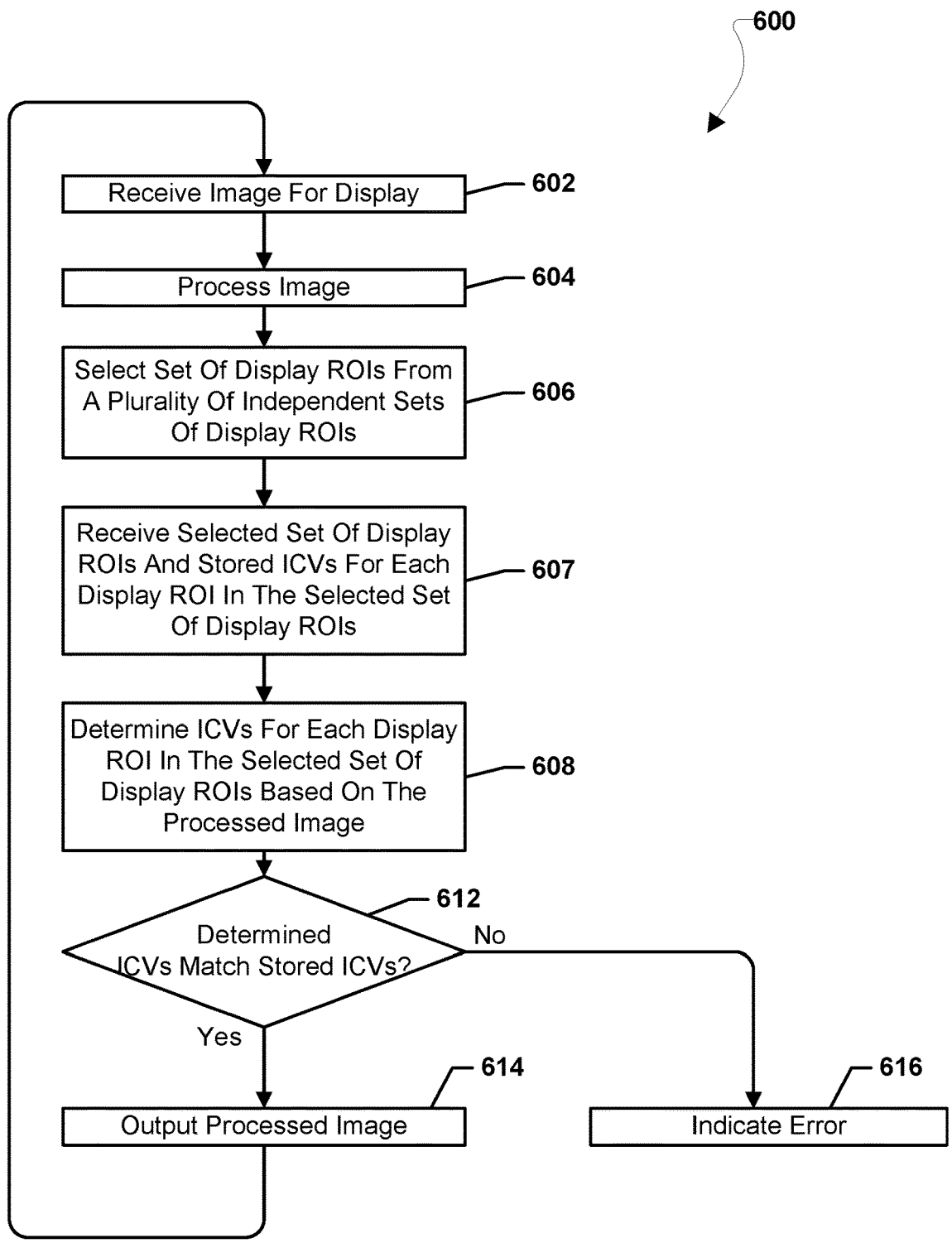
FIG. 6 is a process flow diagram illustrating a method for verifying data integrity for ROIs on a display according to some embodiments.

In response to determining that the selection of sets of display ROIs is complete (i.e., determination block 306="Yes") or in response to determining that the maximum number of sets or display ROIs has been reached (i.e., determination block 308="Yes"), the computing device may operate the display and verify data integrity for all sets of display ROIs in block 316. Method 600 described with reference to FIG. 6 is an example method for verifying data integrity for ROIs on a display the may be used to verify data integrity for all sets of display ROIs according to some embodiments.

Figure 4A:
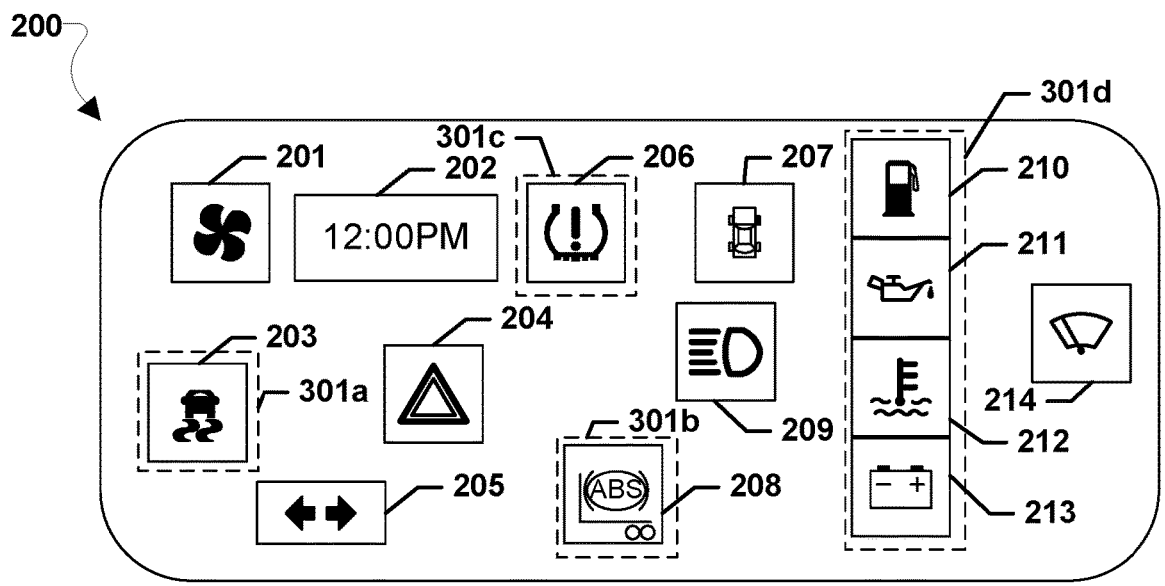
FIGS. 4A, 4B, and 4C illustrate selections of different display ROIs in a user display configuration according to various embodiments.
Figure 4B:
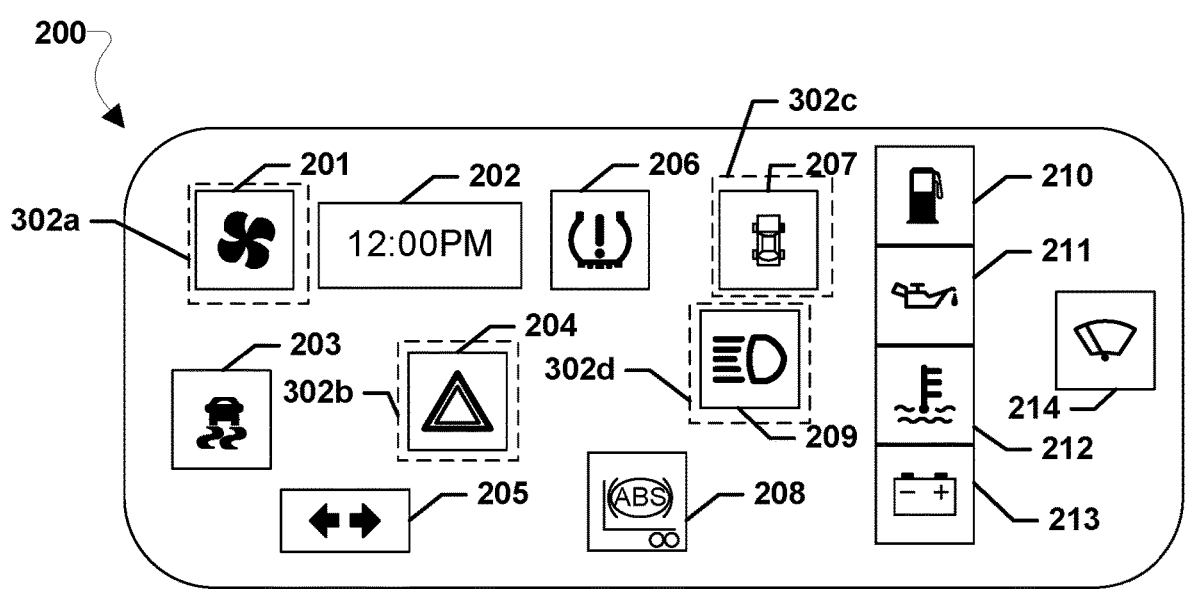
Figure 4C:
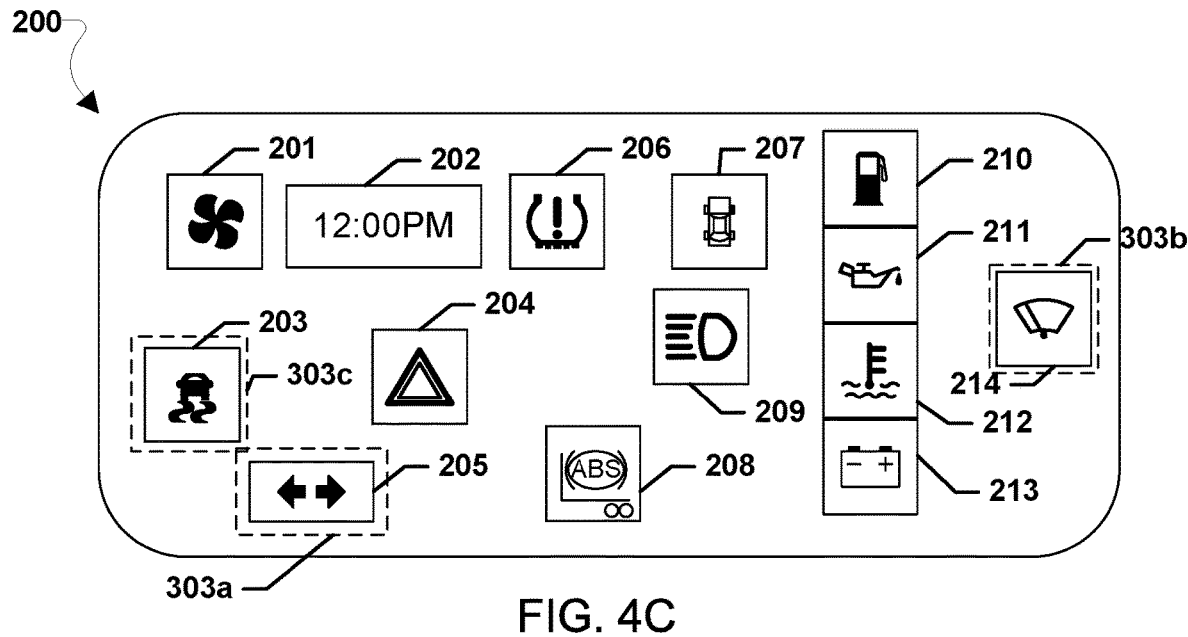

FIGS. 4A, 4B, and 4C illustrate selections of different display ROIs in a user configuration 200 of a display according to various embodiments. With reference to FIGS. 1-4C, the user configuration 200 of the screen of the display is the same user configuration 200 illustrated in FIG. 2. The user may have previously selected and positioned the tell-tale signs 201, 203, 204, 205, 206, 207, 208, 209, 210, 211, 212, 213, and 214, as well as a clock face indication 202 for display. In the user configuration 200, the tell-tale signs 201, 203, 204, 205, 206, 207, 208, 209, 210, 211, 212, 213, and 214 may be safety critical information, while the clock face indication 202 may be non-safety critical information. In some embodiments, the selection of the different display ROIs in the user configuration 200 may be performed according to the operations of method 300 described with reference to FIG. 3.

As illustrated in FIG. 4A, the user may select a first set of display ROIs including four display ROIs 301a, 301b, 301c, and 301d. The user may define display ROI 301a around the tell-tale sign 203. The user may define display ROI 301b around the tell-tale sign 208. The user may define display ROI 301c around the tell-tale sign 206. The user may define display ROI 301d around four tell-tale signs 210, 211, 212, and 213. In this manner, the display ROI 301d may be larger than the display ROIs 301a, 301b, and 301c as it includes four tell-tale signs 210, 211, 212, and 213. Based on the user selection of the display ROIs 301a, 301b, 301c, and 301d, the computing device may determine ICVs for each of the display ROIs 301a, 301b, 301c, and 301d the user selected. As a specific example, the computing device may determine CRCs for each display ROI 301a, 301b, 301c, and 301d based on the stored image or images used to create the tell-tale signs 203, 206, 208, 210, 211, 212, and 213 within the display ROIs 301a, 301b, 301c, and 301d. The set of display ROIs, display ROIs 301a, 301b, 301c, and 301d, and the determined ICVs for those display ROIs may be stored in a memory.

As illustrated in FIG. 4B, the user may select a second set of display ROIs including four display ROIs 302a, 302b, 302c, and 302d. The user may define display ROI 302a around the tell-tale sign 201. The user may define display ROI 302b around the tell-tale sign 204. The user may define display ROI 302c around the tell-tale sign 207. The user may define display ROI 302d around the tell-tale sign 209. Based on the user selection of the display ROIs 302a, 302b, 302c, and 302d, the computing device may determine ICVs for each of the display ROIs 302a, 302b, 302c, and 302d the user selected. As a specific example, the computing device may determine CRCs for each display ROI 302a, 302b, 302c, and 302d based on the stored image or images used to create the tell-tale signs 201, 204, 207, and 209, within the display ROIs 302a, 302b, 302c, and 302d. The set of display ROIs, display ROIs 302a, 302b, 302c, and 302d, and the determined ICVs for those display ROIs may be stored in a memory.

As illustrated in FIG. 4C, the user may select a third set of display ROIs including three display ROIs 303a, 303b, and 303c. The user may define display ROI 303a around the tell-tale sign 205. The user may define display ROI 303b around the tell-tale sign 214. The user may define display ROI 303c around the tell-tale sign 203. The display ROI 303c around the tell-tale sign 203 in the third set of display ROIs in FIG. 4C may correspond to the same display ROI 301a around the tell-tale sign 203 in the first set of display ROIs in FIG. 4A. In this manner, the same display ROI may appear in two different sets of display ROIs. Based on the user selection of the display ROIs 303a, 303b, and 303c, the computing device may determine ICVs for each of the display ROIs 303a, 303b, and 303c the user selected. As a specific example, the computing device may determine CRCs for each display ROI 303a, 303b, and 303c based on the stored image or images used to create the tell-tale signs 203, 205, 214, within the display ROIs 303a, 303b, and 303c. The set of display ROIs 303a, 303b, and 303c, and the determined ICVs for those display ROIs may be stored in a memory. As illustrated in FIGS. 4A, 4B, and 4C, because the clock face indication 202 may be non-safety critical information, no display ROI may be defined around the clock face indication 202.

Figure 5:
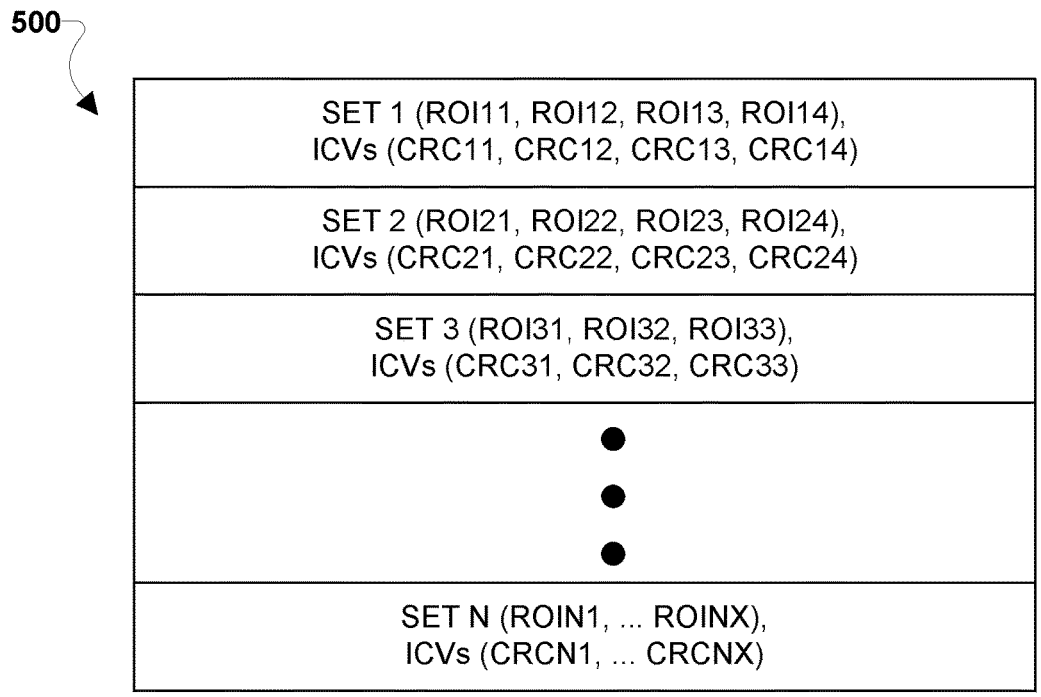
FIG. 5 is a data structure diagram illustrating example different sets of display ROIs and associated sets of integrity check values (ICVs) stored in a memory according to various embodiments.

FIG. 5 is a data structure diagram illustrating example different sets of display ROIs and associated sets of ICVs stored in a memory 500 according to various embodiments. With reference to FIGS. 1-5, the storage of the different display ROIs and ICVs in the memory may be performed according to the operations of method 300 described with reference to FIG. 3. The memory 500 may include 1-N sets of display ROIs stored with their associated ICVs. N may be the number of user defined sets of display ROIs. As an example, a first set of display ROIs may include ROI11, ROI12, ROI13, and ROI14 stored with their associated ICVs, such as CRC11, CRC12, CRC13, and CRC14. A second set of display ROIs may include ROI21, ROI22, ROI23, and ROI24 stored with their associated ICVs, such as CRC21, CRC22, CRC23, and CRC24. A third set of display ROIs may include ROI31, ROI32, and ROI33 stored with their associated ICVs, such as CRC31, CRC32, and CRC33. Similarly, additional numbers of sets through set N may be stored. Set N of display ROIs may include ROIN1 through ROINX, where X is the maximum number of ROIs that may be in a set, stored with corresponding ICVs, CRCN1 through CRCNX. In various embodiments, each of the sets of display ROIs 1 through N may be selected separately and used along with its associated ICVs to validate the display ROIs in images before the images are output to a display.

FIG. 6 illustrates a method 600 for verifying data integrity for ROIs on a display according to some embodiments. With reference to FIGS. 1-6, the method 600 may be implemented in hardware components and/or software components of a computing device, such as an SoC 107. In some embodiments, the operations of the method 600 may be performed in conjunction with the operations of the method 300.

In block 602, the computing device may receive an image for display. The image for display may be received from another system or sensor of a vehicle, such as an ADAS, backup camera, etc., and/or may be received by the computing device fetching an image for display in a portion of a display. In some embodiments, the image may be a composite image formed from a series of images provided by different sources on the vehicle and combined by a layer mixer into a single image. In some embodiments, the operations of method 600 may be performed by the computing device on a per-frame bases and each image received in block 602 may be a frame for output to a display.

In block 604, the computing device may process the image. In various embodiments, the image may be processed by applying various image processing techniques to the image. For example, image processing may include color processing, layer mixing processing, digital signal processing, and/or other types of processing of the image stored in a memory that may be applied to the image before it is ready to be displayed.

Figure 7:
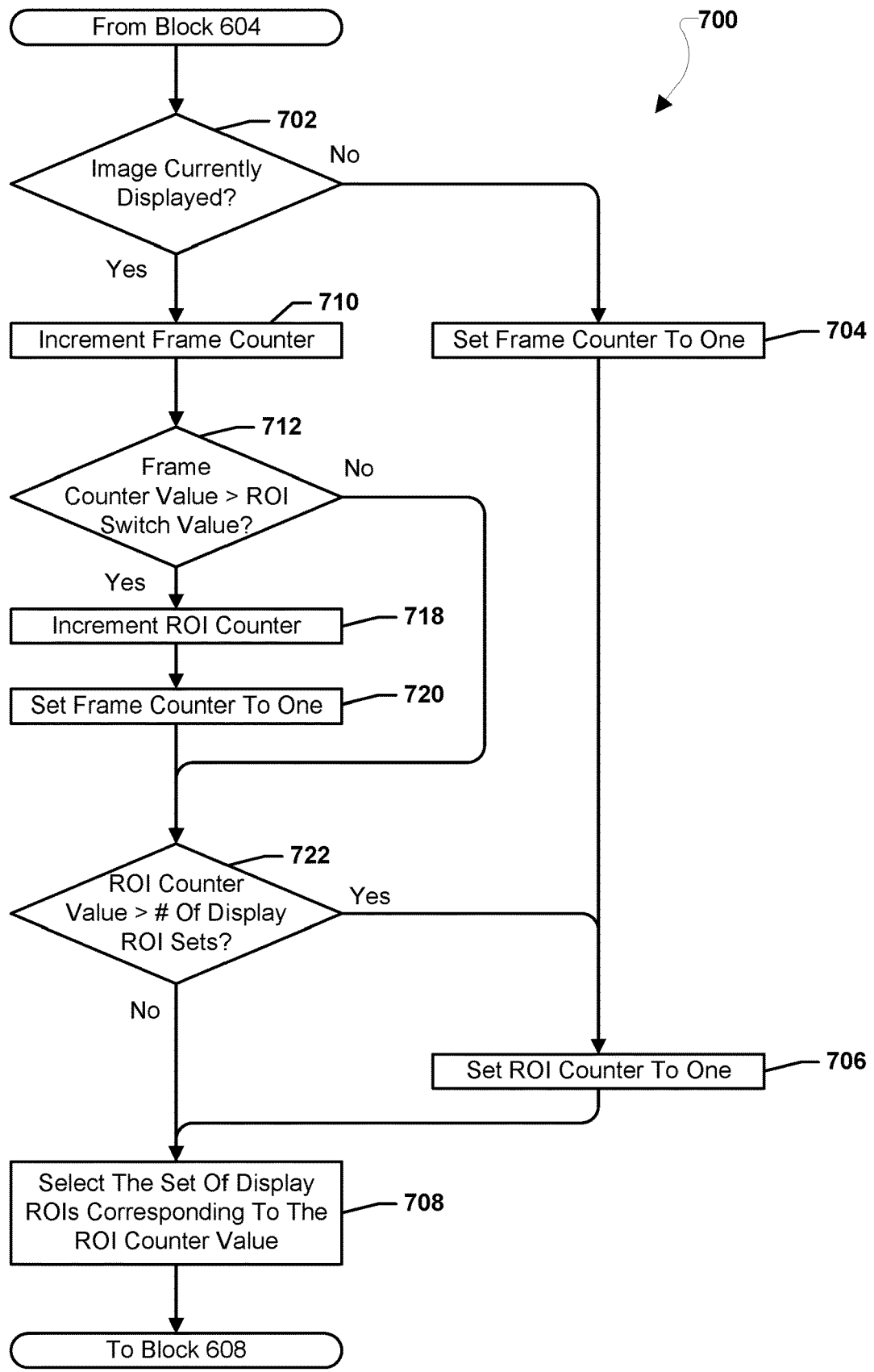
FIG. 7 is a process flow diagram illustrating a method for selecting display ROIs according to some embodiments.

In block 606, the computing device may select a set of display ROIs from a plurality of independent sets of display ROIs. In some embodiments, the selection of a set of display ROIs may include a processor of a computing device, such as a SoC, selecting a set of display ROIs based on a ROI counter value. In some embodiments, the selection of a set of display ROIs may include a hardware counter controlling a multiplexer to output the selected set of display ROIs. In various embodiments, the selection of a set of display ROIs may change after a number of frames have been displayed, such as after one or more frames have been displayed. In various embodiments, the number of frames may be user selected. One example method for selecting a set of display ROIs from a plurality of independent sets of display ROIs is illustrated in FIG. 7.

In block 607, the computing device may receive a selected set of display ROIs and stored ICVs for each display ROI in the selected set of display ROIs. For example, the selected set of display ROIs and stored ICVs for each display ROI in the selected set of display ROIs may be received by the set of display ROIs and stored ICVs for each display ROI in the selected set of display ROIs being fetched from a memory storage location.

In block 608, the computing device may determine ICVs for each display ROI in the selected set of display ROIs based on the processed image. The ICVs may be calculated based on the processed image in the same manner that the stored ICVs were previously calculated. For example, when a display ROI corresponds to a tell-tale sign, the computing device may determine the ICV by calculating an error detecting value, such as a hash, checksum, CRC, MISR, etc., for the processed image using the same process as was used to calculate the stored ICV.

In determination block 612, the computing device may determine whether the determined ICVs match the stored ICVs. For example, the stored ICV may be compared to the calculated ICV based on the processed image to determine whether the values match. When the computing device determines that the stored and calculated ICVs match, this may indicate to the computing device that the processed image(s) is/are error or fault free and ready to be output to the display or displays. When the computing device determines that the stored and calculated ICVs do not match, this may indicate to the computing device that the processed image includes an error or fault.

In response to determining that the determined ICVs match the stored ICVs (i.e., determination block 612="Yes"), the computing device may output the processed image in block 614. Outputting the processed image may include sending the processed image to a display for rendering, providing the processed image to another computing device, such as another SoC (e.g., SoC 115), etc., or providing the image for further processing or other type image handling by the computing device itself. In this manner, only valid images with ICVs that match the ICVs for the selected set of display ROIs may be output. The method 600 may continue or repeat when the computing device receives another image in block 602.

In response to determining the that the determined ICVs do not match the stored ICVs (i.e., determination block 612="No"), the computing device may indicate an error in block 616. For example, the computing device may output a warning to a user, enter a safety mode of operation for the vehicle, and/or take another action.

FIG. 7 illustrates a method 700 for selecting display ROIs according to some embodiments. With reference to FIGS. 1-7, the method 700 may be implemented in hardware components and/or software components of a computing device, such as an SoC 107. In some embodiments, the operations of the method 700 may be performed in conjunction with the operations of the methods 300 and/or 600.

In response to the computing device processing the image in block 604 of the method 600 as described, the computing device may determine whether an image is currently displayed in determination block 702. The determining whether an image is currently displayed may enable the computing device to determine whether start-up or reset of the computing device has just occurred or whether the image received is a first frame for display.

In response to determining that an image is not currently displayed (i.e., determination block 702="No"), the computing device may set the frame counter to one in block 704. The frame counter may be a hardware component and/or software component of a computing device tracking the number of frames rendered on the display. For example, the frame counter may be a count-up type counter incremented each time a frame is received or rendered on the display.

In block 706, the computing device may set the ROI counter to one. The frame counter may be a hardware component and/or software component of a computing device. For example, the ROI counter may be a count-up type counter.

In block 708, the computing device may select the set of display ROIs corresponding to the ROI counter value. In response to selecting the set of display ROIs corresponding to the ROI counter value, the computing device may determine ICVs for each display ROI in the selected set of display ROIs based on the processed image in block 608 of the method 600 as described.

In response to determining that an image is currently displayed (i.e., determination block 702="No"), the computing device may increment the frame counter in block 710.

In determination block 712, the computing device may determine whether the frame counter value is greater than a display ROI switch value. The display ROI switch value may be a number of frames after which a new set of display ROIs is to be selected for use in validating the display output. The display ROI switch value may be a user selected value. In some embodiments, the display ROI switch value may be one frame. In some embodiments, the display ROI switch value may be a number of frames, such as two, three, or more frames.

In response to determining that the frame counter value is not greater than the display ROI switch value (i.e., determination block 712="No"), the computing device may determine whether the ROI counter value is greater than the number of display ROI sets in determination block 722. The number of display ROI sets may be the number of display ROI sets stored in a memory, such as memory 500.

In response to determining that the ROI counter value is not greater than the number of display ROI sets (i.e., determination block 722="No"), the computing device may select the set of display ROIs corresponding to the ROI counter value in block 708. In response to selecting the set of display ROIs corresponding to the ROI counter value, the computing device may determine ICVs for each display ROI in the selected set of display ROIs based on the processed image in block 608.

In response to determining that the frame counter value is greater than the display ROI switch value (i.e., determination block 712="Yes"), the computing device may increment the ROI counter in block 718, and set the frame counter to one in block 720.

In determination block 722, the computing device may determine whether the ROI counter value is greater than the number of display ROI sets.

In response to determining that the ROI counter value is greater than the number of display ROI sets (i.e., determination block 722="Yes"), the computing device may set the ROI counter to one in block 706. In this manner, after the Nth and final set in the set of display ROIs has been previously selected, the selection may return to the first set of display ROIs in the memory.

In response to determining that the ROI counter value is greater than the number of display ROI sets (i.e., determination block 722="No") or after setting the ROI counter to one in block 706, the computing device may select the set of display ROIs corresponding to the ROI counter value in block 708. In response to selecting the set of display ROIs corresponding to the ROI counter value, the computing device may determine ICVs for each display ROI in the selected set of display ROIs based on the processed image in block 608 of the method 600 as described.

Figure 8A:
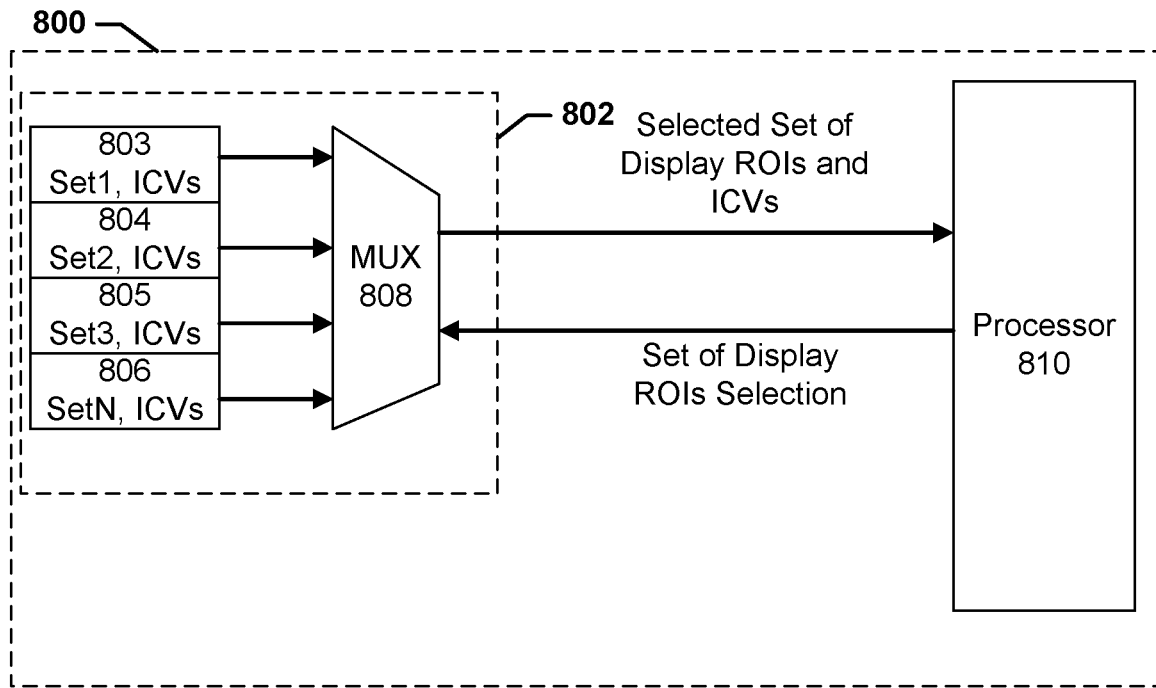
FIG. 8A is a component block diagram of a portion of a system-on-chip (SoC) according to an embodiment.

FIG. 8A is a component block diagram of a portion 800 of a SoC suitable for implementing various embodiments. With reference to FIGS. 1-8A, the portion 800 may be part of an SoC of a vehicle, such as SoC 107. In some embodiments, the portion 800 of the SoC may be configured to perform operations of methods 300, 600, and/or 700. The portion 800 may include a memory 802 connected to a processor 810. The memory 802 may include, along with other hardware components, registers 803, 804, 805, and 806 connected to a multiplexer 808. The memory 802 may be similar to memory 500 described with reference to FIG. 5. The registers 803, 804, 805, and 806 may store sets of display ROIs and their associated ICVs (e.g., register 803 may store display ROI Set1 and associated ICVs, register 804 may store display ROI Set2 and associated ICVs, register 805 may store display ROI Set3 and associated ICVs, register 806 may store display ROI SetN and associated ICVs). The registers 803, 804, 805, and 806 may be selectable by the multiplexer 808 which may be controlled by the processor 810. For example, the processor 810 may send a selection of a set of display ROIs to the multiplexer 808 to control the multiplexer 808 to output that selected set of display ROIs and associated stored ICVs to the processor 810.

Figure 8B:
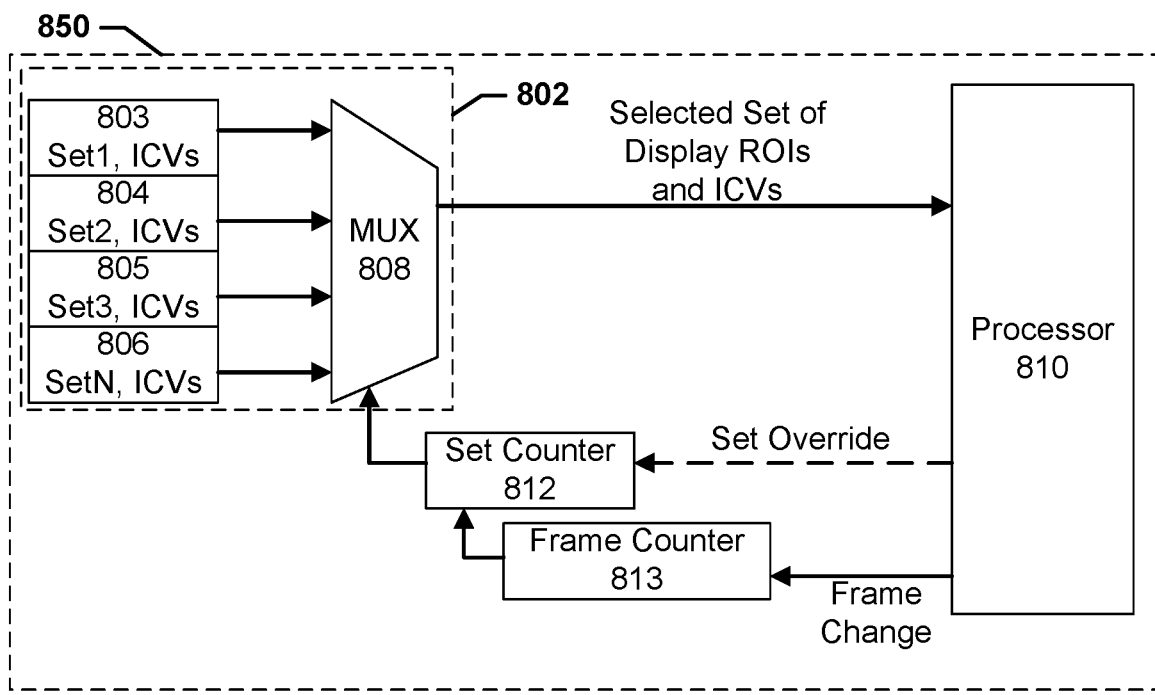
FIG. 8B is a component block diagram of a portion of a SoC according to an embodiment.

FIG. 8B is a component block diagram of a portion 850 of a SoC according to an embodiment. With reference to FIGS. 1-8B, the portion 850 may be part of an SoC of a vehicle, such as SoC 107. In some embodiments, the portion 850 of the SoC may be configured to perform operations of methods 300, 600, and/or 700. Portion 850 may be similar to portion 800 described with reference to FIG. 8A, except that portion 850 may include a set counter 812 and frame counter 813 to control selection of the set of display ROIs.

The frame counter 813 may be connected to the processor 810 and configured to receive indications of each frame change. The frame counter 813 may be connected to the set counter 812. The frame counter 813 may be configured to trigger a change in the set counter after a number of frames, such as one frame, two frames, more than two frames, etc. The number of frames may be user configurable. The set counter 812 may be a count-up type counter configured to switch between set numbers when triggered by the frame counter 813. The set counter 812 may rotate between the set number sequentially and reset back to one once all sets have been selected. The set counter 812 may be connected to the multiplexer 808 and may control the multiplexer 808. Based on the set counter 812, the multiplexer 808 may output that selected set of display ROIs and associated stored ICVs to the processor 810. In an optional embodiment, the processor 810 may be connected to the set counter 812 and the processor 810 may be configured to override or otherwise reset the set counter 812.

Figure 9:
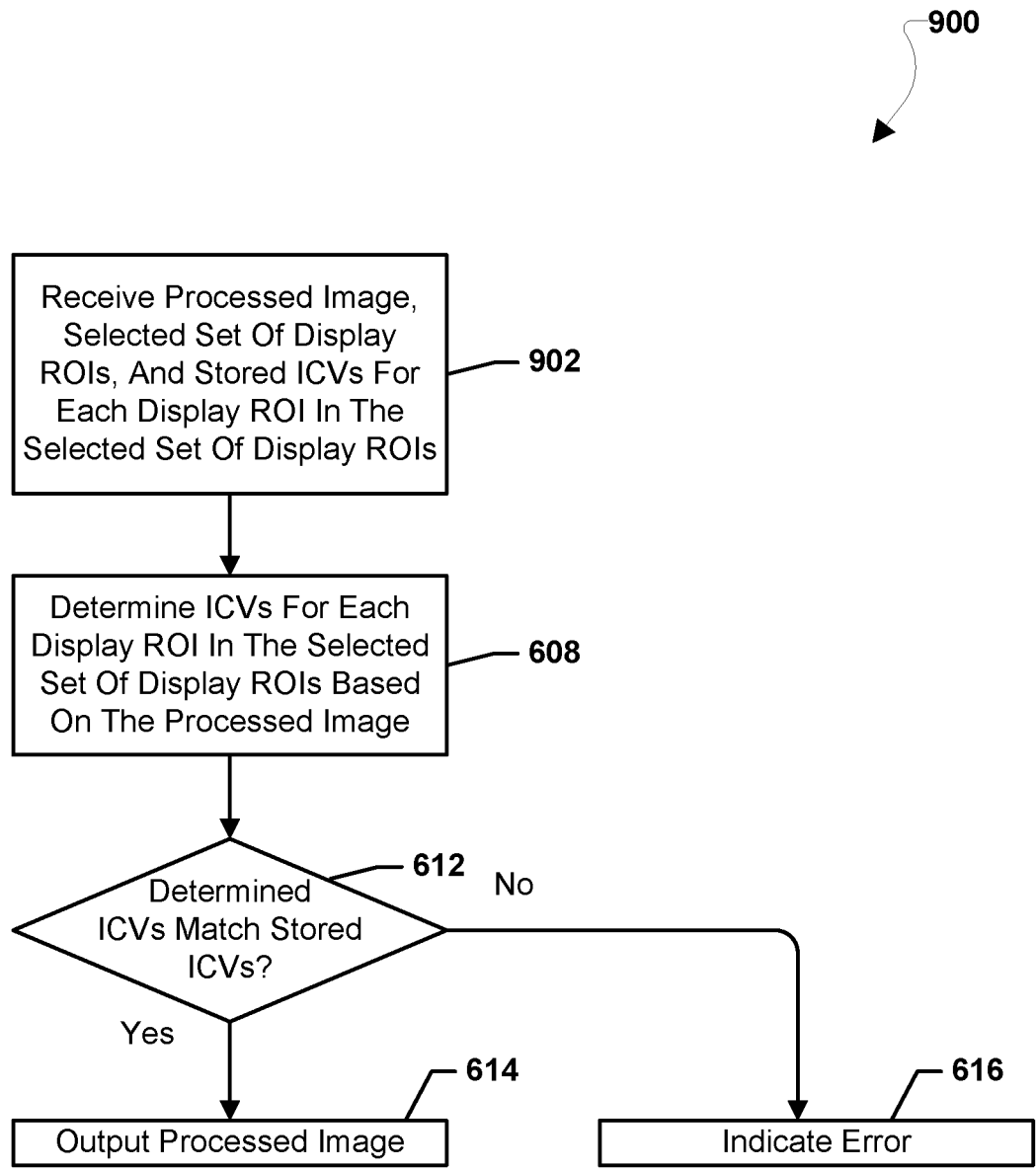
FIG. 9 is a process flow diagram illustrating a method for verifying data integrity for ROIs on a display according to some embodiments.
Figure 10:
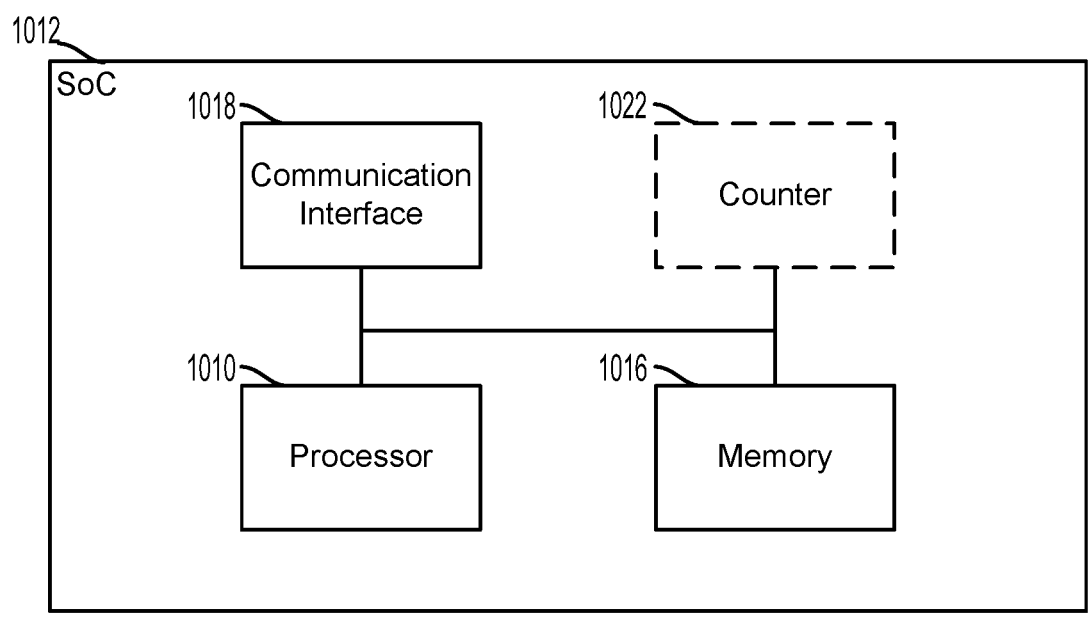
FIG. 10 is a component block diagram of a processing device suitable for implementing various embodiments.

FIG. 9 illustrates an embodiment method 900 for verifying data integrity for ROIs on a display. With reference to FIGS. 1-9, the method 900 may be implemented in hardware components and/or software components of a computing device, such as SoC 115. In some embodiments, the operations of the method 900 may be performed in conjunction with the operations of the methods 300, 600, and/or 700.

In block 902, the computing device may receive a processed image, a selected set of display ROIs, and stored ICVs for each display ROI in the selected set of display ROIs. In some embodiments, the computing device may be located between an actual display (e.g., display 110) and a first SoC (e.g., SoC 107) and may receive the processed image, the selected set of display ROIs, and stored ICVs for each display ROI in the selected set of display ROIs from the first SoC. In this manner, the computing device may operate as a destination check to confirm that the image for output on the display was received correctly.

In block 608, 612, 614, and 616, the computing device may perform operations of like numbered blocks of method 600 as described to verify the data integrity for the display ROIs before rendering on the display. In this manner, end-to-end data content integrity from source to destination may be checked.

Various embodiments (including, but not limited to, embodiments discussed with reference to FIGS. 1-9) may be implemented within a computing device configured to be used in a vehicle (e.g., automotive vehicle 100, an aerial vehicle, etc.), such as an SoC 1012. For example, the computing device may be a SoC, such as SoC 107 and/or 115, and/or an SoC including portions 800 and/or 850 of an SoC. As such, the SoC 1012 may implement the methods 300, 600, 700, and 900 in FIGS. 3, 6, 7, and 9. With reference to FIGS. 1-10, the SoC 1012 may include (but is not limited to) a processor 1010, a memory 1016, and a communication interface 1018. Additionally, the SoC 1012 may optionally include one or more counters 1022. The processor 1010 may include any of a variety of processing devices, for example any number of processor cores.

The memory 1016 of the SoC 1012 may be a volatile or non-volatile memory configured for storing data and processor-executable instructions for access by the processor 1010. The SoC 1012 may include one or more memories 1016 configured for various purposes. One or more memories 1016 may include volatile memories such as random access memory (RAM) or main memory, or cache memory.

Some or all of the components of the SoC 1012 may be arranged differently and/or combined while still serving the functions of the various aspects. The SoC 1012 may not be limited to one of each of the components, and multiple instances of each component may be included in various configurations of the SoC 1012.

The processors 810, 1010 may be any programmable microprocessor, microcomputer or multiple processor chip or chips that can be configured by software instructions (applications) to perform a variety of functions, including the functions of the various embodiments described above. In some devices, multiple processors may be provided, such as one processor dedicated to wireless communication functions and one processor dedicated to running other applications. Typically, software applications may be stored in the internal memory before they are accessed and loaded into the processors 810, 1010. The processors 810, 1010 may include internal memory sufficient to store the application software instructions. In many devices, the internal memory may be a volatile or nonvolatile memory, such as flash memory, or a mixture of both. For the purposes of this description, a general reference to memory refers to memory accessible by the processors 810, 1010 including internal memory or removable memory plugged into the device and memory within the processors 810, 1010 themselves.

Various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment. For example, one or more of the operations of the methods 300, 600, 700, and 900 may be substituted for or combined with one or more operations of the methods 300, 600, 700, and 900, and vice versa.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In various embodiments, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module, which may reside on a non-transitory computer-readable or processor-readable storage medium. Non-transitory server-readable, computer-readable or processor-readable storage media may be any storage media that may be accessed by a computer or a processor. By way of example but not limitation, such non-transitory server-readable, computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory server-readable, computer-readable and processor-readable media. Additionally, the operations of a method or algorithm may reside as one or any combination or set of codes and/or instructions on a non-transitory server-readable, processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the scope of the claims. Thus, the claims are not intended to be limited to the embodiments described herein but are to be accorded the widest scope consistent with the following claims and the principles and novel features disclosed herein.

What is claimed is:

1. A method of verifying data integrity for regions of interest on a display, comprising:
    determining whether a frame counter value tracking a number of frames rendered on a display is greater than a display region of interest switch value;

selecting a first set of display regions of interest from a plurality of independent sets of display regions of interest in response to determining that the frame counter value is greater than the display region of interest switch value, wherein each of the plurality of independent sets of display regions of interest is associated with its own set of stored integrity check values;

determining integrity check values for each display region of interest in the first selected set of display regions of interest based on a first image, wherein each display region of interest in the first selected set of display regions of interest has a respective integrity check value that is determined based on the first image to be displayed in each respective region of interest;

determining whether the determined integrity check values match stored integrity check values for each display region of interest in the first selected set of display regions of interest; and outputting the first image to the display in response to determining that the determined integrity check values match the stored integrity check values for each display region of interest in the first selected set of display regions of interest.

2. The method of claim 1, further comprising:
indicating an error in response to determining that at least one of the determined integrity check values does not match the stored integrity check values for at least one display region of interest in the first selected set of display regions of interest.

3. The method of claim 1, further comprising, after outputting the first image to the display:

determining whether the frame counter value tracking the number of frames rendered on the display is greater than the display region of interest switch value;

selecting a second set of display regions of interest from the plurality of independent sets of display region of interest in response to determining that the frame counter value is greater than the display region of interest switch value;

determining integrity check values for each display region of interest in the second selected set of display regions of interest based on a second image;

determining whether the determined integrity check values match stored integrity check values for each display region of interest in the second selected set of display regions of interest; and outputting the second image to the display in response to determining that the determined integrity check values match the stored integrity check values for each display region of interest in the second selected set of display regions of interest.

4. The method of claim 3, wherein the stored integrity check values for each display region of interest in the first selected set of display regions of interest and the stored integrity check values for each display region of interest in the second selected set of display regions are stored in a same memory.

5. The method of claim 4, wherein the first set of display regions of interest and the second set of display regions of interest are user selected.

6. The method of claim 3, wherein the display region of interest switch value is configured as a number of frames after which a new set of display regions of interest from the plurality of independent sets of display region of interest is to be selected.

7. The method of claim 6, wherein the number of frames is user selected.

8. The method of claim 6, wherein:
the display is a vehicle display; and
the first set of display regions of interest and the second set of display regions of interest are safety critical image areas within the vehicle display.

9. A non-transitory processor-readable medium having stored thereon processor-executable instructions configured to cause a processor to perform operations comprising:

determining whether a frame counter value tracking a number of frames rendered on a display is greater than a display region of interest switch value;

selecting a first set of display regions of interest from a plurality of independent sets of display regions of interest in response to determining that the frame counter value is greater than the display region of interest switch value, wherein each of the plurality of independent sets of display regions of interest is associated with its own set of stored integrity check values;

determining integrity check values for each display region of interest in the first selected set of display regions of interest based on a first image, wherein each display region of interest in the first selected set of display regions of interest has a respective integrity check value that is determined based on the first image to be displayed in each respective region of interest;

determining whether the determined integrity check values match stored integrity check values for each display region of interest in the first selected set of display regions of interest; and outputting the first image to the display in response to determining that the determined integrity check values match the stored integrity check values for each display region of interest in the first selected set of display regions of interest.

10. The non-transitory processor-readable medium of claim 9, wherein the stored processor-executable instructions are configured to cause a processor to perform operations further comprising:

indicating an error in response to determining that at least one of the determined integrity check values does not match the stored integrity check values for at least one display region of interest in the first selected set of display regions of interest.

11. The non-transitory processor-readable medium of claim 9, wherein the stored processor-executable instructions are configured to cause a processor to perform operations further comprising, after outputting the first image to the display:

determining whether the frame counter value tracking the number of frames rendered on the display is greater than the display region of interest switch value;

selecting a second set of display regions of interest from the plurality of independent sets of display region of interest in response to determining that the frame counter value is greater than the display region of interest switch value;

determining integrity check values for each display region of interest in the second selected set of display regions of interest based on a second image;

determining whether the determined integrity check values match stored integrity check values for each display region of interest in the second selected set of display regions of interest; and outputting the second image to the display in response to determining that the determined integrity check values match the stored integrity check values for each display region of interest in the second selected set of display regions of interest.

12. The non-transitory processor-readable medium of claim 11, wherein the stored processor-executable instructions are configured to cause a processor to perform operations such that the stored integrity check values for each display region of interest in the first selected set of display regions of interest and the stored integrity check values for each display region of interest in the second selected set of display regions are stored in a same memory.

13. The non-transitory processor-readable medium of claim 12, wherein the stored processor-executable instructions are configured to cause a processor to perform operations such that the first set of display regions of interest and the second set of display regions of interest are user selected.

14. The non-transitory processor-readable medium of claim 11, wherein the stored processor-executable instructions are configured to cause a processor to perform operations such that the display region of interest switch value is configured as a number of frames after which a new set of display regions of interest from the plurality of independent sets of display region of interest is to be selected.

15. The non-transitory processor-readable medium of claim 14, wherein the stored processor-executable instructions are configured to cause a processor to perform operations such that the number of frames since is user selected.

16. The non-transitory processor-readable medium of claim 14, wherein the stored processor-executable instructions are configured to cause a processor to perform operations:
the display is a vehicle display; and
the first set of display regions of interest and the second set of display regions of interest are safety critical image areas within the vehicle display.

17. A system-on-chip for use in a vehicle, comprising:
a memory storing a plurality of independent sets of display regions of interest, wherein each of the plurality of independent sets of display regions of interest is associated with its own set of integrity check values stored in the memory;
a counter connected to the memory, wherein the counter is configured to track a number of frames rendered on a display; and
a processor connected to the memory and the counter, wherein the processor is configured to:
determine whether a value of the counter is greater than a display region of interest switch value;
selecting a first set of display regions of interest from the plurality of independent sets of display regions of interest in response to determining that the value of the counter is greater than the display region of interest switch value;
determine integrity check values for each display region of interest in the first selected set of display regions of interest based on a first image, wherein each display region of interest in the first selected set of display regions of interest has a respective integrity check value that is determined based on the first image to be displayed in each respective region of interest;
determine whether the determined integrity check values match stored integrity check values for each display region of interest in the first selected set of display regions of interest; and
output the first image to the display in response to determining that the determined integrity check values match the stored integrity check values for each display region of interest in the first selected set of display regions of interest.

18. The system-on-chip of claim 17, wherein:
the processor is further configured to, after outputting the first image to the display:
determine whether the value of the counter is greater than the display region of interest switch value;
select a second set of display regions of interest from the plurality of independent sets of display region of interest in response to determining that the value of the counter is greater than the display region of interest switch value;
determine integrity check values for each display region of interest in the second selected set of display regions of interest based on a second image;
determine whether the determined integrity check values match stored integrity check values for each display region of interest in the second selected set of display regions of interest; and
output the second image to the display in response to determining that the determined integrity check values match the stored integrity check values for each display region of interest in the second selected set of display regions of interest.

19. The system-on-chip of claim 18, wherein the stored integrity check values for each display region of interest in the first selected set of display regions of interest and the stored integrity check values for each display region of interest in the second selected set of display regions are stored in different registers of the memory.

20. The system-on-chip of claim 19, wherein:
the memory further comprises a multiplexer connected to each of the different registers of the memory, the counter, and the processor; and
an output of the multiplexer is controlled by the counter.

21. The system-on-chip of claim 18, wherein the processor is configured such that the display region of interest switch value is configured as a number of frames after which a new set of display regions of interest from the plurality of independent sets of display regions of interest is to be selected.

22. The system-on-chip of claim 18, wherein:
the display is a vehicle display; and
the first set of display regions of interest and the second set of display regions of interest are safety critical image areas within the vehicle display.

* * * * *